United States Patent [19]

Jensen et al.

[11] Patent Number: 4,492,882

[45] Date of Patent: Jan. 8, 1985

[54] INTEGRATED CIRCUIT FOR CHIP OP/AMP INTERFACE

[75] Inventors: Arthur S. Jensen; Keefer S. Stull, Jr., both of Baltimore, Md.

[73] Assignee: Westinghouse Electric Corp., Pittsburgh, Pa.

[21] Appl. No.: 402,171

[22] Filed: Jul. 26, 1982

Related U.S. Application Data

[63] Continuation-in-part of Ser. No. 163,549, Jun. 27, 1980, Pat. No. 4,341,963.

[51] Int. Cl.³ .............................................. G06G 7/12
[52] U.S. Cl. .................................... 307/497; 307/475; 330/253; 330/260; 330/307
[58] Field of Search ....................... 330/253, 260, 307; 307/475, 497; 377/59, 60, 62, 63

[56] References Cited

U.S. PATENT DOCUMENTS 4,126,836 11/1978 Carnes et al. ..................... 377/60 X Primary Examiner—James B. Mullins
Attorney, Agent, or Firm—W. G. Sutcliff

[57] ABSTRACT

An integrated circuit including a charge-coupled device for accumulating charge in a potential well and a pair of metal-oxide semiconductor (MOS) transistors connected to form a differential amplifier. The gate of one transistor is coupled to the CCD potential well. The integrated circuit is provided with means for coupling the differential outputs, the drain of each transistor of the differential amplifier, to the differential inputs of an external op amp. Means are provided for coupling electrical feedback from the output of the op amp to the gate of the second transistor of the differential amplifier.

7 Claims, 5 Drawing Figures

INTEGRATED CIRCUIT FOR CHIP OP/AMP INTERFACE

CROSS REFERENCE TO RELATED APPLICATION

This application is a continuation-in-part of application Ser. No. 163,549, filed June 27, 1980, now U.S. Pat. No. 4,341,963.

BACKGROUND OF THE INVENTION

1. Field of the Invention

This invention relates to circuits for interfacing integrated circuit outputs to circuitry external to the integrated circuit, and, more particularly, to circuits for interfacing the outputs of charge-coupled devices to external operational amplifiers.

2. Description of the Prior Art

At the output of a CMOS, PMOS, or NMOS integrated circuit chip, it is common to use an electrometer MOSFET in an emitter-follower mode as a current input to an off-chip inverting operational amplifier (op-amp). Such a configuration is particularly common in integrated circuit chips having a linear or area array of photodiode detectors, having a charge-coupled device (CCD) detector array, or having a CCD for data processing.

However, such a circuit connection having a length on the order of $\frac{1}{2}''$ results in a rather large stray capacitance-to-ground at the inverting input to the op-amp. This stray capacitance arises from the bonding pads and the wire bonds between the chips, and introduces a zero (i.e., a factor in the numerator) in the transfer function for the op-amp input voltage noise. This causes the high-frequency portion of this noise to be boosted to the point where this op-amp noise is the limiting factor in the circuit performance.

In addition, the output signal amplitude is a direct function of the electrometer transconductance. Since the electrometer transconductance is sensitive to temperature, the output signal amplitude will vary accordingly. This makes the matching of output signal from channel-to-channel very difficult since temperatures are likely to vary from channel-to-channel.

Accordingly, it is desirable to provide a chip/op-amp interface circuit with a reduced stray capacitance and having an output signal amplitude relatively insensitive to temperature variations.

SUMMARY OF THE INVENTION

An integrated circuit comprises a semiconductor substrate including therein signal means for providing an electrical output signal, which signal means is coupled to a differential amplifier which is totally or partially disposed in the substrate. Means are included on the substrate for coupling at least one output of the differential amplifier to the inputs of an external operational amplifier. And, means are included for coupling a feedback circuit between an output of the external operational amplifier and an inverting input of the differential amplifier which may be on or external to the substrate.

Since the feedback loop of the operational amplifier goes around the differential amplifiers they become a part of the feedback loop. Hence, the differential amplifiers and all the lumped circuit constants associated with them are subject to the usual degenerative action of negative feedback and their characteristics have only a second order effect on the circuit operation.

In greater detail, the signal means includes a charge-coupled device (CCD) in the substrate comprising a potential well means for accumulating electrical charge. The differential amplifier includes a pair of metal-oxide-semiconductor (MOS) transistors having differential (inverting and non-inverting) inputs, differential outputs, and a common source region. Means are included for providing external access to at least one differential output of the differential amplifier and to the common source region of the differential amplifier.

External circuitry commonly associated with the present invention proper includes means for controlling the transferring and accumulating of charge in the CCD and means for removing the charge accumulated. Common external circuitry also includes an operational amplifier having an output and differential inputs, and includes a feedback circuit associated with the operational amplifier. The differential outputs of the differential amplifier are coupled to the differential inputs of the operational amplifier and the feedback circuit is coupled between the output of the operational amplifier and the inverting input of the differential amplifier.

DESCRIPTION OF THE PREFERRED EMBODIMENT

Figure 1:
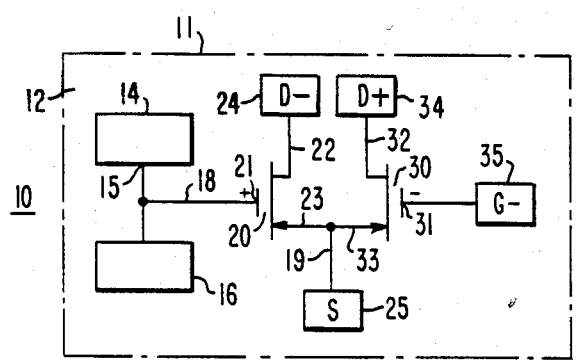
FIG. 1 shows a schematic view of an integrated circuit 10 according to the teachings of the present invention.

FIG. 1 shows an integrated circuit 10 on a semiconductor substrate 12 within the lines at 11 according to the teachings of the present invention. Formed in the substrate 12 is a charge-coupled potential well 14 having an output 15 for accumulating a quantity of electrical charge. Generally, the potential well 14 is contemplated to include a number of charge-coupled potential wells all of which are effective to transfer and accumulate charge in a single output potential well. The integrated circuit 10 also includes means 16 formed in the substrate 12 for resetting the potential well 14, that is, for removing charge accumulated in the well 14.

A pair 20 and 30 of metal-oxide-semiconductor (MOS) transistors are formed in the substrate 12 coupled together differentially to provide inverting and non-inverting inputs and outputs. Specifically, transistor 20 includes a non-inverting gate input region 21, an inverting drain output region 22 coupled to a bonding pad 24 on the substrate 12, and a source region 23. Transistor 30 includes an inverting gate input region 31 coupled to a bonding pad 35, a non-inverting drain output region 32 coupled to a bonding pad 34 on the substrate 12, and a source region 33. Means 19 formed in the substrate 12 are included for coupling both of the source regions 23 and 33 to a bonding pad 25. Also, means 18 may be, for example, on the order of 50 μm in length and formed in the substrate 12 are included for coupling the output 15 of the potential well 14 to the non-inverting gate input 21 of the transistor 20.

Figure 2:
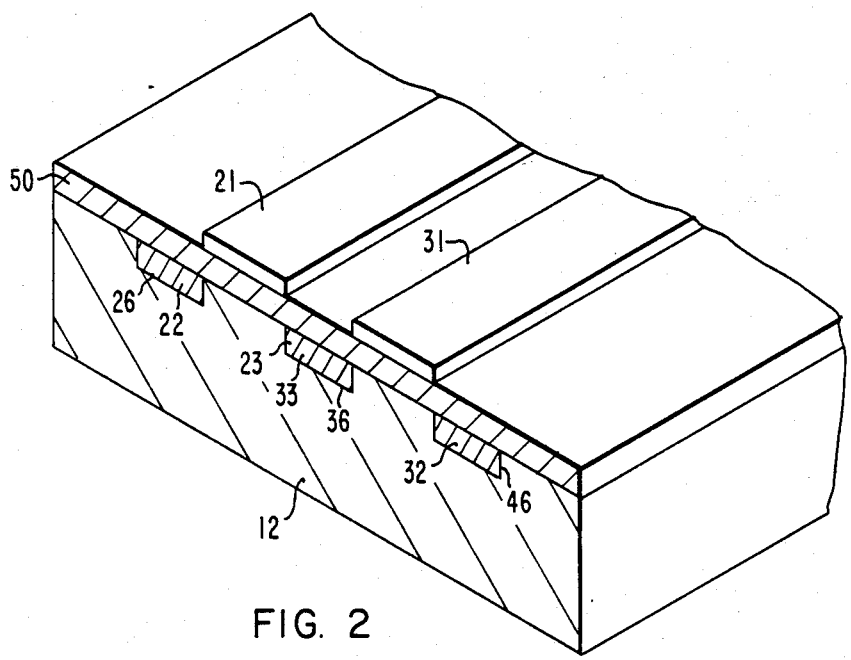
FIG. 2 shows a sectional view of a portion of the integrated circuit of FIG. 1.

FIG. 2 shows a more detailed view of one embodiment of the transistors 20 and 30. In FIG. 2, a sectional view of a portion of the substrate 12 includes therein similar elements of FIG. 1 designated with like reference characters.

In particular, the drain region 22 comprises a semiconductor impurity region disposed in the substrate 12 and forming a p-n junction 26 therewith. The source regions 23 and 33 comprise a common semiconductor impurity region disposed in the substrate 12 spaced apart from the p-n junction 26 and forming a p-n junction 36 with the substrate 12. The drain region 32 comprises a semiconductor impurity region disposed in the substrate 12 and forming a p-n junction 46 therewith. The gate inputs 21 and 31 are each formed by disposing a layer of metal over the substrate 12 and separated therefrom by a layer 50 of insulating material. Specifically, the non-inverting gate input 21 is disposed on the layer 50 over the space between the p-n junctions 26 and 36. And, the inverting gate input 31 is disposed on the layer 50 over the space between the p-n junctions 36 and 46. Since the differential transistors 20 and 30 are in such close proximity, they essentially operate at the same temperature, thereby minimizing temperature effects on the output signal.

Figure 3:
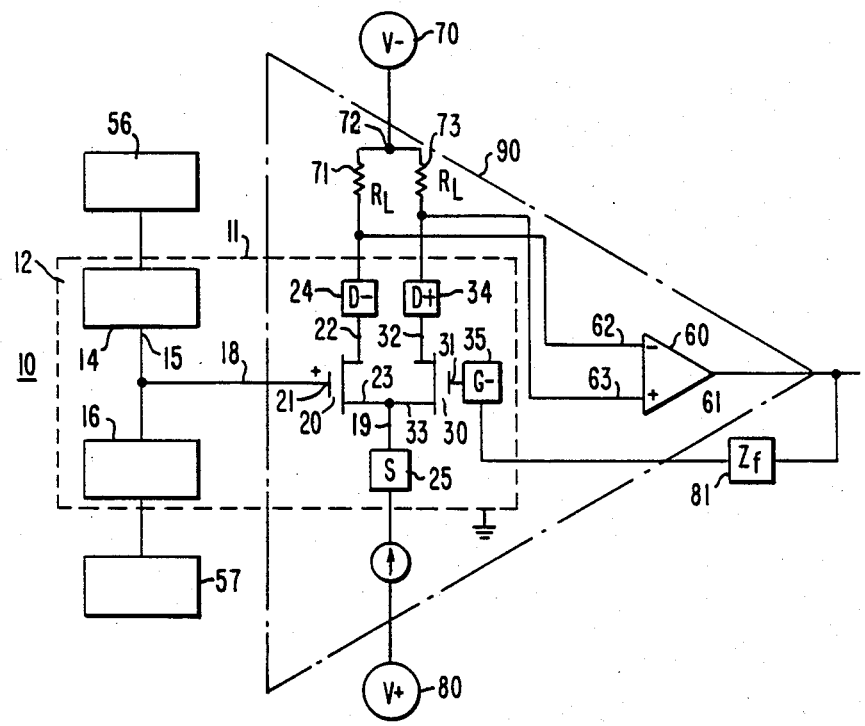
FIG. 3 shows a schematic view of the integrated circuit of FIG. 1 along with block representations of circuitry associated therewith according to the teachings of the present invention.

FIG. 3 shows the integrated circuit 10 of FIG. 1 along with associated output circuitry and block representation of certain control circuitry. The control circuitry includes external means 56 for controlling the transferring and accumulating of charge in the potential well means 14. In addition, external means 57 is included for controlling the removing of charge from the potential well means 14. The output circuitry associated with the integrated circuit 10 commonly comprises, as shown in FIG. 3 an operational amplifier 60 having an output 61 and having inverting and non-inverting inputs 62 and 63, respectively. According to the teachings of the present invention, the operational amplifier 60 is coupled to the integrated circuit 10 such that the non-inverting output 32 of the integrated circuit 10 is coupled to the non-inverting input 63 of the operational amplifier 60 via the bonding pad 34 and, conversely, the inverting output 22 of the integrated circuit 10 is coupled to the inverting input 62 of the operational amplifier 60 via the bonding pad 24. In addition, a source 70 of potential is coupled to both the non-inverting and inverting outputs 32 and 22 via resistors 73 and 71, respectively. The potential source 70 should be negative in cases where the substrate 12 is n-type and should be positive in cases where the substrate 12 is p-type. A source 80 of current is coupled to the common sources 23 and 33 via the bonding pad 25.

The "true" operational amplifier boundary in accordance with the teachings of the present invention is within the lines at 90. A feedback circuit 81, normally coupled across the input and output of the operational amplifier 60, is coupled, according to the teachings of the present invention, to the inverting gate input 31 of the transistor 30 via the bonding pad 35. The feedback circuit 81 can comprise, as is common, a parallel RC circuit, which determines the gain and bandwidth from a signal on input gate 21 to a signal on the output 61.

Figure 4:
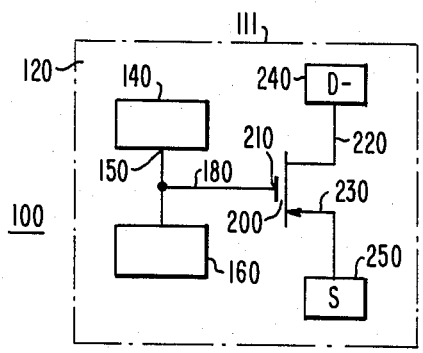
FIG. 4 shows an alternate schematic view of an integrated circuit 100 according to the teachings of the present invention.

FIG. 4 shows an integrated circuit 100 on a semiconductor substrate 120 within the lines at 111 according to the teachings of the present invention. Formed in the substrate 120 is a charge-coupled potential well 140 having an output 150 for accumulating a quantity of electrical charge. Generally, the potential well 140 is contemplated to include a number of charge-coupled potential wells all of which are effective to transfer and accumulate charge in a single output potential well. The integrated circuit 100 also includes means 160 formed in the substrate 120 for resetting the potential well 140, that is, for removing charge accumulated in the well 140.

A metal-oxide-semiconductor (MOS) transistor 200 is formed in the substrate 120. Transistor 200 includes a non-inverting gate input region 210, an inverting drain output region 220 coupled to bonding pad 240 on the substrate 120, and source region 230 is coupled to bonding pad 250. Also, means 180 may be, for example, on the order of 50 μm in length and formed in the substrate 120 for coupling the output 150 of the potential well 140 to the non-inverting gate input 210 of transistor 200.

Figure 5:
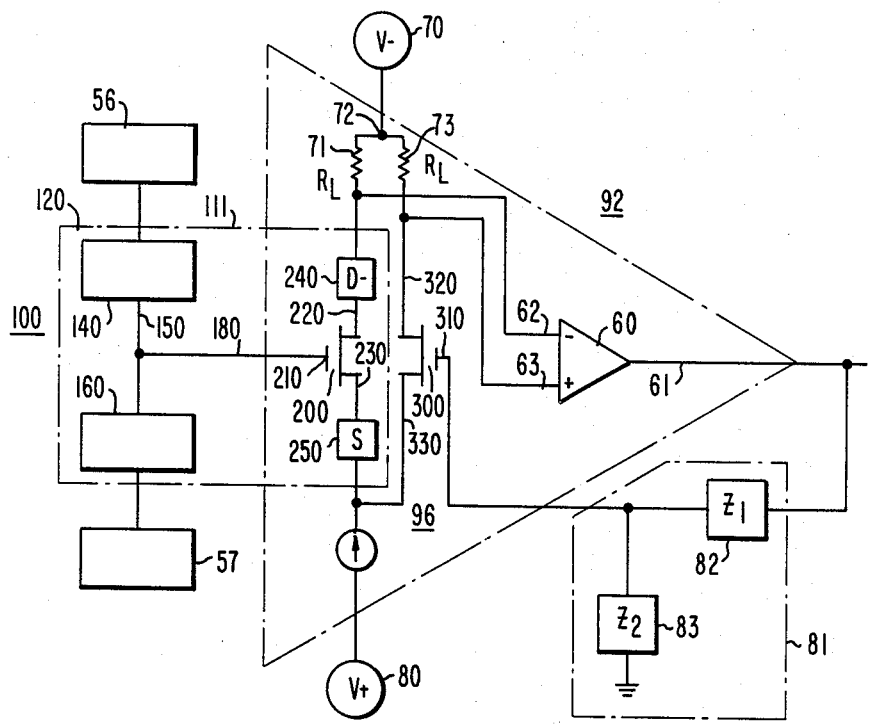
FIG. 5 shows a schematic view of the integrated circuit of FIG. 4 along with block representations of circuitry associated therewith according to the teachings of the present invention.

FIG. 5 shows the integrated circuit 100 with associated output circuitry and block representation of certain control circuitry. In FIG. 5, like references are used for functions corresponding to the apparatus of FIG. 3. The control circuitry includes external means 56 for controlling the transferring and accumulating of charge in the potential well means 140. In addition, external means 57 is included for controlling the removing of charge from the potential well means 140. The output circuitry associated with the integrated circuit 100 includes as shown in FIG. 5 an operational amplifier 60 having an output 61 and having inverting and non-inverting inputs 62 and 63, respectively and transistor 300 having a drain 320, source 330 and gate 310. According to the teachings of the present invention, the non-inverting input 63 of operational amplifier 60 is coupled to the drain 320 of transistor 300 and to one side of resistor 73. The inverting output or drain 220 of transistor 200 is coupled to the inverting input 62 of the operational amplifier 60 via the bonding pad 240. In addition, a source 70 of potential is coupled to both the non-inverting and inverting outputs at drains 320 and 220 via resistors 73 and 71, respectively. The potential source 70 should be negative in cases where the substrate 120 is n-type and should be positive in cases where the substrate 120 is p-type. A source 80 of current is coupled to source 230 of transistor 200 via bonding pad 250 and to source 330 of transistor 300.

The "true" op amp boundary in accordance with the teachings of the present invention is within the lines at 92. A feedback circuit 81, normally coupled across the input and output of the operational amplifier 60, is coupled, according to the teachings of the present invention, to the inverting gate input 310 of the transistor 300. Transistors 200 and 300 and resistors 71 and 73 form a differential amplifier 86 coupled to operational amplifier 60 which together forms operational amplifier 92. The feedback circuit 81 can comprise, as is common, a parallel RC circuit, which determines the gain and bandwidth from a signal on input gate 21 to a signal on the output 61.

Feedback circuit 81 may include an impedance 82 having an impedance $Z_2$ in series and an impedance 83 having an impedance $Z_2$ in shunt to ground potential.

Operational amplifier 92 is a non-inverting operational amplifier with a gain nearly equal to $(Z_1+Z_2)/Z_2$. If $Z_2$ is omitted, then the gain is unity and operational amplifier 92 would exhibit a voltage follower characteristic. A gain greater than unity is desirable.

The embodiment of FIG. 5 incorporates the usual on-chip electrometer shown as transistor 200 within the feedback loop of the operational amplifier 92. In the prior art, the on-chip electrometer has always been outside the feedback loop, hence its noise and the input noise of the subsequent differential amplifier 60 have not been attenuated by negative feedback. In the embodiment of FIG. 5, a means for enclosing the noise of the electrometer and differential amplifier within the feedback loop is shown, thus achieving a new, lower noise level.

What we claim is:

1. A circuit for coupling an electrical signal from an integrated circuit with portions of said circuit external said integrated circuit comprising:
    an operational amplifier external to said integrated circuit having a first non-inverting input, a second inverting input and an output;
    said integrated circuit including a semiconductor substrate;
    differential amplifying means including first and second transistors, said first transistor in said substrate;
    means in said substrate for coupling said first transistor to said electrical signal;
    a feedback circuit;
    said output of said operational amplifier coupled through said feedback circuit to said second transistor of said differential amplifying means;
    said differential amplifying means having a first non-inverting output and a second inverting output;
    said first non-inverting output of said differential amplifying means coupled to said non-inverting input of said operational amplifier;
    said second inverting output of said differential amplifying means coupled to said inverting input of said operational amplifier.

2. The circuit of claim 1 wherein said first and second transistors are field effect transistors each having a gate, source, and drain.

3. The circuit of claim 2 wherein the source of said first transistor is coupled to the source of said second transistor and to a source of current.

4. The circuit of claim 2 wherein the gate of said first transistor is coupled to said electrical signal.

5. The circuit of claim 2 wherein said feedback circuit is coupled to the gate of said second transistor.

6. The circuit of claim 2 wherein the drain of said first transistor is coupled through a resistor to a voltage and provides said second inverting output.

7. The circuit of claim 2 wherein the drain of said second transistor is coupled through a resistor to a voltage and provides said first non-inverting output.

* * * * *